United States Patent [19]

Ajit

[11] Patent Number: 5,498,884
[45] Date of Patent: Mar. 12, 1996

[54] MOS-CONTROLLED THYRISTOR WITH CURRENT SATURATION CHARACTERISTICS

[75] Inventor: Janardhanan S. Ajit, Redondo Beach, Calif.

[73] Assignee: International Rectifier Corporation, El Segundo, Calif.

[21] Appl. No.: 265,397

[22] Filed: Jun. 24, 1994

[51] Int. Cl.$^6$ .............................. H01L 29/74; H01L 31/111
[52] U.S. Cl. .................. 257/137; 257/132; 257/133; 257/138; 257/146; 257/154; 257/163
[58] Field of Search .......................... 257/132, 133, 257/137, 138, 146, 154, 163

[56] References Cited

U.S. PATENT DOCUMENTS

| | | | |
|---|---|---|---|
| 5,105,244 | 4/1992 | Bauer | 257/133 |
| 5,198,687 | 3/1993 | Boliga | 257/133 |
| 5,286,981 | 2/1994 | Lilja et al. | 257/133 |
| 5,293,054 | 3/1994 | Shakar et al. | 257/152 |
| 5,336,907 | 8/1994 | Nakanishi et al. | 257/133 |
| 5,444,272 | 8/1995 | Ajit | 257/137 |

FOREIGN PATENT DOCUMENTS

WO9322796 11/1993 WIPO.

*Primary Examiner*—Ngân V. Ngô
*Attorney, Agent, or Firm*—Ostrolenk, Faber, Gerb & Soffen

[57] ABSTRACT

A MOS-controlled thyristor which has current saturation characteristics and does not have any parasitic thyristor structure. In some embodiments, the device has two gate drives and is a four terminal device. In other embodiments, the device requires only a single gate drive and is a three terminal device. The device can be constructed in a cellular geometry. In all embodiments, the device has superior turn-off characteristics and a wider Safe-Operating-Area because the $N^{++}$ emitter/P base junction is reverse biased during turn-off.

24 Claims, 11 Drawing Sheets

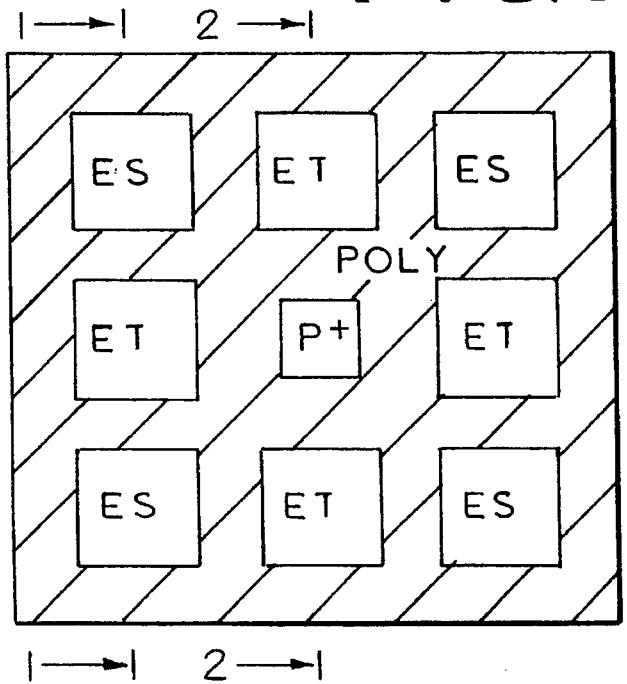
F I G. 9B

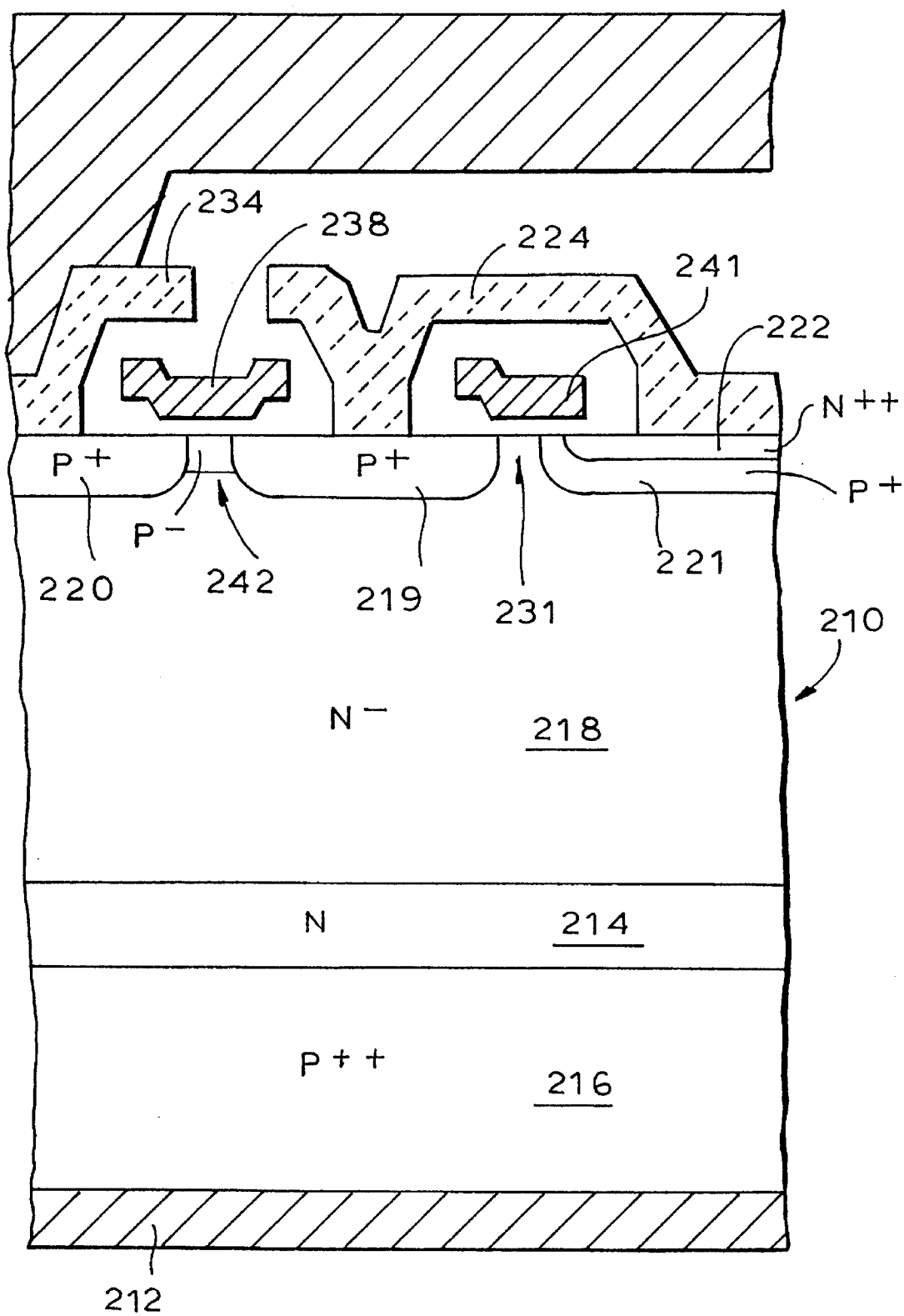
F I G. 6

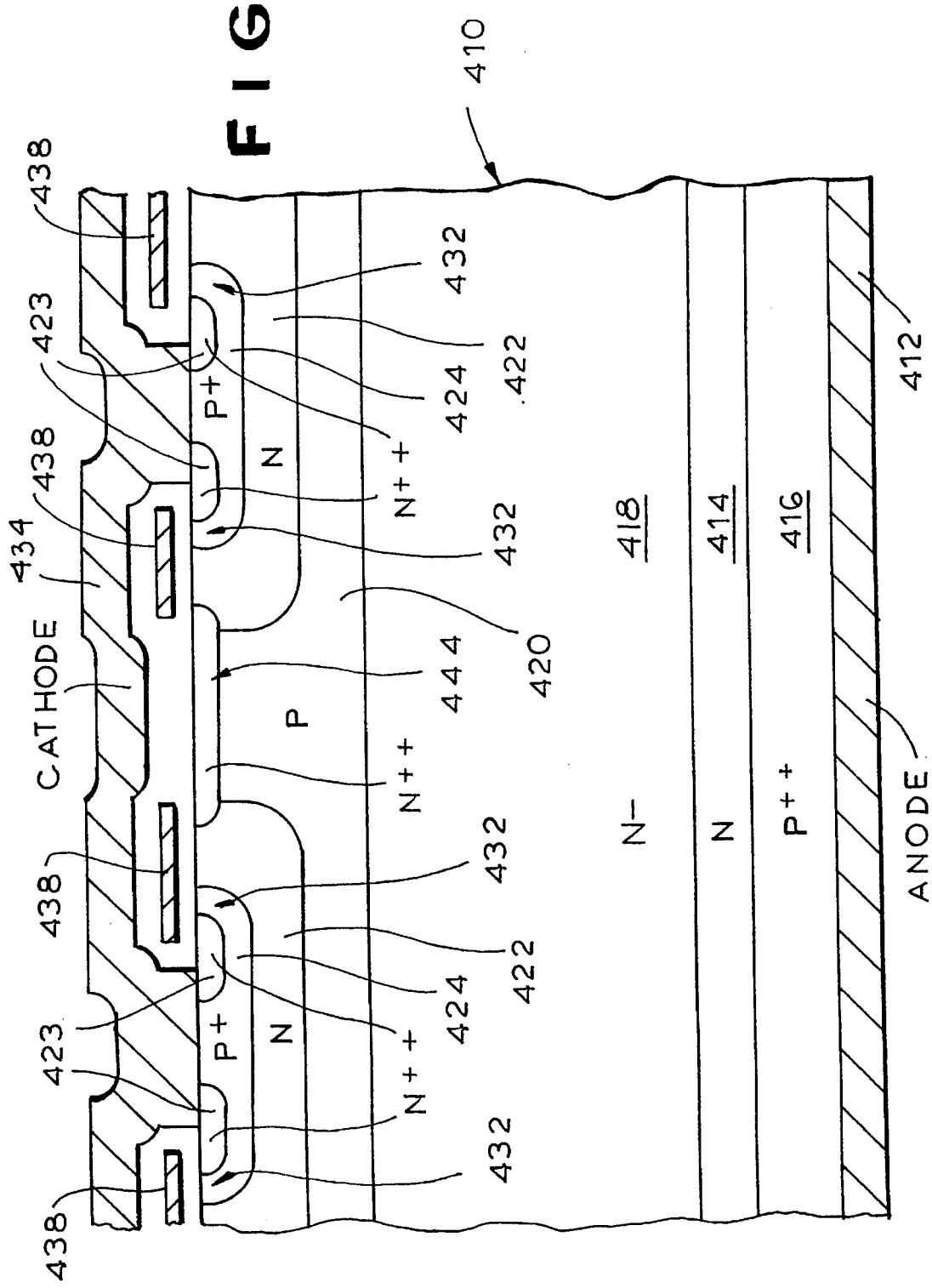

5,498,884

MOS-CONTROLLED THYRISTOR WITH CURRENT SATURATION CHARACTERISTICS

BACKGROUND OF THE INVENTION

1. Field of Invention

The present invention relates to a MOS-controlled thyristor and more particularly, to a MOS-controlled thyristor with current saturation characteristics and without any parasitic thyristor structure.

2. Description of the Related Art

Power semiconductor structures that combine bipolar conducting mechanisms with a MOS control are well known. The insulated gate bipolar transistor (IGBT) is an example of such a device, in which the base current of a bipolar structure is controlled via an integrated MOSFET. The IGBT is best suited for high-voltage power electronic applications with blocking voltages in the range of 600 volts. IGBTs capable of handling higher voltages have a higher on-state voltage drop, which is disadvantageous. Since a lower on-state voltage drop is achievable by carrying the on-state current through a thyristor structure, MOS-gated thyristors have received considerable interest for high current, high voltage applications.

Two types of MOS-gated thyristors are the MOS-controlled thyristor (MCT) and the emitter-switched thyristor (EST). In the MCT, as described in an article by V. A. K. Temple, *IEEE International Electron Device Meeting (IEDM) Technical Digest,* San Francisco (December 1984), pp. 282–85, a cathode short circuit is switched via a MOS gate. However, the commercial development of the MCT has been limited because of complex fabrication requirements and current filamentation problems during turn-off, and because it does not have current saturation characteristics.

The EST, as shown in FIG. 1, basically consists of a MOSFET in series with a thyristor, and is said to be "emitter-switched." The EST lends itself to easier fabrication than the MCT. While the EST exhibits current saturation characteristics, it is, however, limited by an inherent parasitic thyristor, shown in FIG. 1, which bypasses the gate-controlled n-channel MOSFET. Accordingly, a need exists for an EST which has current saturation characteristics, but is not limited by a parasitic thyristor structure within the device.

SUMMARY OF THE INVENTION

The present invention overcomes the disadvantages of the prior and achieves the foregoing objective by providing a MOS-controlled thyristor which, in a first embodiment, comprises a wafer of semiconductor material having first and second spaced, parallel planar surfaces. A relatively lightly doped N-type layer extends from the first semiconductor surface, while a P-type layer extends from the second semiconductor surface.

A P-type base is formed in the relatively lightly doped N-type layer and extends from the first semiconductor surface to a first depth beneath the first semiconductor surface. An N-type emitter region formed in the P-type base extends from the first semiconductor surface to a second depth beneath the semiconductor surface which is shallower than the first depth to create an N-type emitter/P-type base junction, the N-type emitter region being radially inwardly spaced along the first semiconductor surface along edges of the P-type base, such that the edges of the P-type base extend to the first semiconductor surface, thereby defining a first channel region along a first of the edges. A metal strap is disposed on the first semiconductor surface and connects the emitter region to the P-type base along a second of the edges.

First and second P-type regions are formed in the relatively lightly doped N-type layer and extend from the first surface of the wafer. The first and second P-type regions are laterally spaced from the second and first edges of the P-type base, respectively, such that the relatively lightly doped N-type layer which extends to the first semiconductor surface therethrough forms second and third channel regions.

A first gate insulation layer is disposed on the first semiconductor surface and extends over at least the second channel region. A first gate electrode is disposed on the first gate insulation layer and overlies the second channel region.

A second gate insulation layer is disposed on the first semiconductor surface and extends over at least the first and third channel regions. A second gate electrode is disposed on the second gate insulation layer means and overlies the first and third channel regions.

An anode electrode is connected to the P-type layer disposed on the second semiconductor surface. A cathode electrode is connected to the first and second P-type regions on the first semiconductor surface.

The MOS-controlled thyristor of the present invention preferably further includes an N-type layer disposed between the P-type layer and the relatively lightly doped N-type layer. The P-type layer and the N-type emitter are preferably relatively highly doped.

In the MOS-controlled thyristor of the first embodiment described above, the N-type emitter has a lateral length which creates a sufficient voltage drop in the P-type base to forward bias the N-type emitter/P-type base junction when the thyristor is in an on-state, which is necessary for the thyristor to latch on. Consequently, the P-type base must be made relatively long with light doping. An alternative embodiment eliminates this requirement.

In the alternative embodiment, the first and second P-type regions are adjacent to and laterally spaced from one another, and only the second P-type region is adjacent to and laterally spaced from the P-type base region. A third P-type region is adjacent to and laterally spaced from the P-type base region. The metal strap in this embodiment connects the N-type emitter to the second P-type base region. A first insulated gate overlies the channel region in the N-type layer between the first and second P-type regions, and a second insulated gate overlies the channel region in the N-type layer between the second P-type region and the P-type base. The second insulated gate also overlies the channel region formed at the edge of the P-type base between the N-type emitter and the relatively lightly doped N-type layer. A third insulated gate overlies the channel region in the N-type layer between the P-type base and the third P-type region. The third insulated gate also overlies the channel region formed at the second edge of the P-type base between the N-type emitter and the relatively lightly doped N-type layer. The third insulated gate is electrically connected to the second insulated gate or, optionally, the second insulated gate can be left floating or be absent. The first and third P-type regions are contacted by the cathode metal on the first semiconductor surface. An anode electrode is connected to the P-type layer disposed on the second semiconductor surface.

As in the first embodiment, an N-type layer is preferably disposed between the P-type layer and the relatively lightly doped N-type layer.

The first, second and third P-type regions, and the P-type base are preferably relatively highly doped, and the P-type layer and said N-type emitter are preferably very highly doped. Optionally, a relatively lightly doped P-type region may be provided in the channel region between the first and second P-type regions to form a depletion p-channel MOS-FET. Also optionally, the third P-type region can be eliminated.

Both the first and second embodiments of the invention described above require two gate and thus result in four terminal devices. In a third embodiment of the invention, only one gate is necessary.

In the third embodiment, a P-type well is formed in the relatively lightly doped N-type layer and extends a first depth beneath the upper surface of the wafer. An N-type well is formed within the P-type well, the N-type well being radially inwardly spaced along the upper surface of the wafer from an edge of the P-type well, thereby defining a first channel region disposed in the P-type well. A P-type base is formed in the N-type well, the P-type base being radially inwardly spaced along the upper surface of the wafer from an edge of the N-type well, thereby defining a second channel region disposed in the N-type well. Finally, an N-type source region is formed in the P-type base, the N-type source region being radially inwardly spaced along the upper surface of the wafer from an edge of the P-type base, thereby defining a third channel region disposed in the P-type base.

A P-type region is formed in the relatively lightly doped N-type layer, the P-type region being laterally spaced from the edge of the P-type well to define a fourth channel region which is disposed in the relatively lightly doped N-type layer between the P-type region and the P-type well.

An insulated gate is disposed on the upper surface of the wafer and overlies the first, second, third and fourth channel regions. An anode electrode is connected to the P-type layer disposed on the bottom surface of the wafer, while a cathode electrode is connected to the P-type base, the N-type source and the P-type region on the upper surface of the wafer.

As in the first and second embodiments an N-type layer is preferably disposed between the P-type layer and the relatively lightly doped N-type layer. The P-type layer and the N-type source are preferably very highly doped. The device of the third embodiment is preferably provided in a cellular geometry in which the P-type well and the first P-type region each comprise cells, the cells being preferably polygonal and disposed side-by-side in a symmetric array and having a polygonal shape with an overlying electrode grid. Optionally, the P-type region and associated fourth channel region can be eliminated.

In the fourth embodiment, the device is formed of an array of clusters of cells. In this embodiment, a P-type well is formed in the N-type layer and extends a first depth beneath the upper surface of the wafer. An N-type well is formed in a portion within the P-type well, the N-type well being radially inwardly spaced along the upper surface of the wafer from an edge of the P-type well, thereby defining a first channel region disposed in the P-type well. A P-type base is formed in a portion within in the N-type well, the P-type base being radially inwardly spaced along the upper surface of the wafer from an edge of the N-type well, thereby defining a second channel region disposed in the N-type well. An N-type source region is formed in the P-type base, the N-type source region being radially inwardly spaced along the upper surface of the wafer from an edge of the P-type base, thereby defining a third channel region disposed in the P-type base. Finally, an N-type emitter region is formed in a portion within the P-type well, the N-type emitter region being radially inwardly spaced along the upper surface of the wafer from an edge of the P-type base, thereby defining a fourth channel region disposed in the P-type well.

A P-type region is formed in the N-type layer, the P-type region being laterally spaced from the edge of the P-type well to define a fifth channel region which is disposed in the N-type layer between the P-type region and the P-type well. An insulated gate is disposed on the upper surface of the wafer and overlies the first, second, third, fourth and fifth channel regions. An anode electrode is connected to the P-type layer disposed on the bottom surface of the wafer, while a cathode electrode is connected to the P-type base, the N-type source and the P-type region on the upper surface of the wafer.

As in the first and second embodiments, an N-type layer is preferably disposed between the P-type layer and the N-type layer. The P-type layer and the N-type source and emitter are preferably very highly doped.

The fourth embodiment of the invention is preferably provided as an array of cells in which the P-type well, N-type well, P-type base and N-type source comprise a first cell, the N-type emitter disposed within the P-type well comprises a second cell, and the P-type region comprises a third cell, the cells being disposed side-by-side in a symmetric array and having a polygonal shape.

Advantageously, all embodiments of the present invention have current saturation characteristics without any parasitic thyristor structure. Superior turn-off and a wider Safe-Operating-Area are achieved by the present invention because all embodiments have the emitter/base junction reverse-biased during turn-off. Furthermore, the junction patterns are easily fabricated.

Other features and advantages of the present invention will become apparent from the following description of the invention which refers to the accompanying drawings.

BRIEF DESCRIPTION OF THE DRAWINGS

FIG. 6 is a cross-sectional view of a variation of the embodiment of FIG. 4 using a depletion p-channel MOSFET.

FIG. 9B is a top view of a unit cluster of cells; FIG. 9C is a cross-sectional view through section line 1—1 of FIG. 9B.

DETAILED DESCRIPTION OF THE PREFERRED EMBODIMENTS

Figure 1:
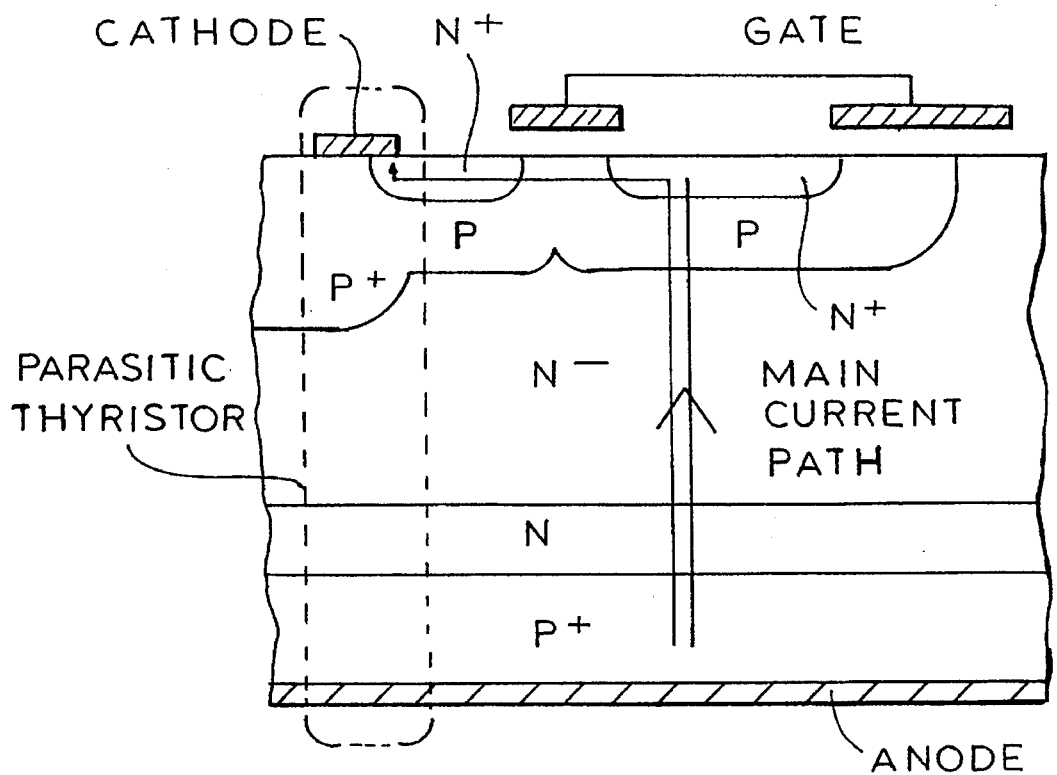
FIG. 1 is a cross-sectional view of a typical prior art Emitter Switched Thyristor (EST).
Figure 2:
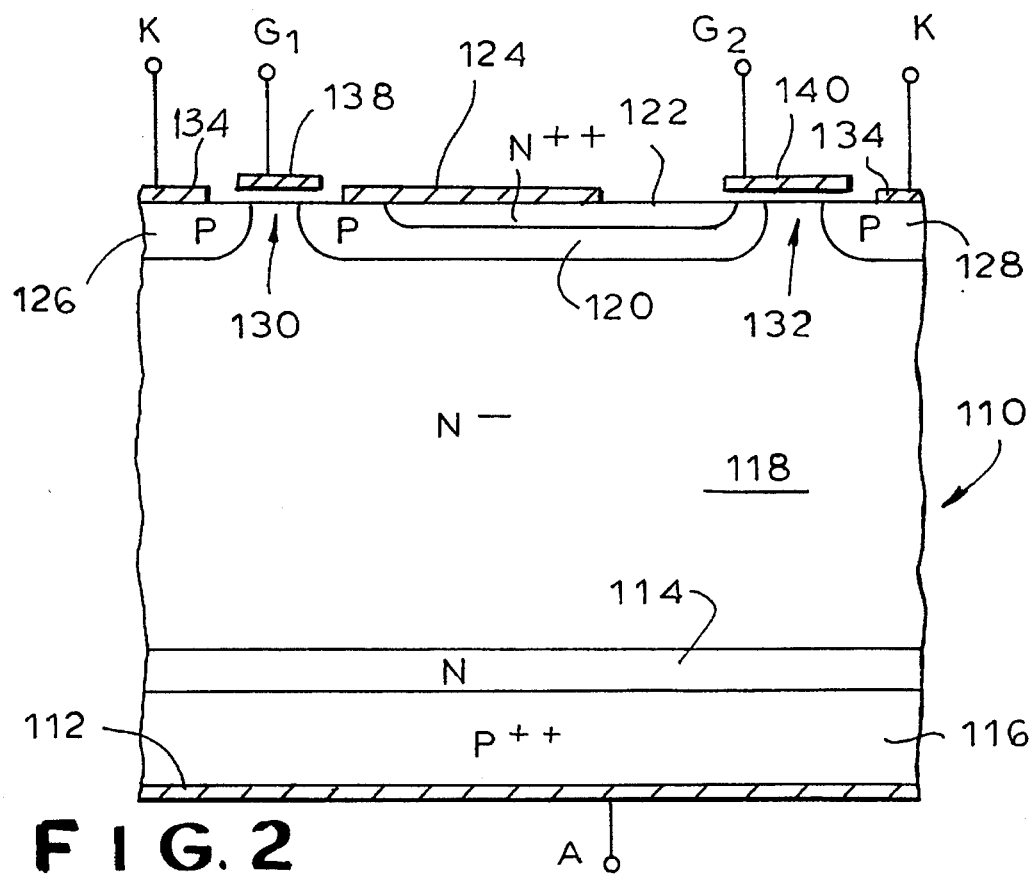
FIG. 2 is a cross-sectional view of a first embodiment of the present invention.

A first embodiment of the MOS-controlled thyristor of the present invention is shown in FIG. 2. MOS-controlled thyristor 110 is a vertical conduction device.

An N-type layer 114 and a very highly doped $P^{++}$ region 116 are disposed on the underside of an $N^-$ layer 118. For lower voltage applications (<1200 V), $N^-$ layer 118 is preferably epitaxially grown on an N epi/$P^{++}$ substrate. For higher voltage applications (>1200 V), $N^-$ layer 118 is preferably the starting substrate material and N layer 114 and $P^{++}$ region 116 are backside diffusions.

An anode electrode 112 on the bottom surface of the device covers $P^+$ region 116. Anode electrode 112 is coupled to an anode terminal A.

The layer thicknesses and concentrations depend on the device blocking voltage. For 2,500 V device, the doping density and thickness of $N^-$ drift region are in the range of $2\times10^{13}$ cm$^{-3}$ and 500 µm, respectively. The doping density of $P^{++}$ region 116 is preferably greater than $5\times10^{19}$ cm$^{-3}$, with a thickness greater than 1 µm. The doping density of N layer 114 is preferably approximately $5\times10^{17}$ cm$^{-3}$, with a thickness of approximately 7 µm.

Disposed within $N^-$ layer 118 is a P-type base 120, which also forms the source of the p-channel MOSFET of the device, as described in further detail below. An $N^{++}$ emitter region 122 is disposed within P-base 120, and is electrically shorted thereto by a floating metal strap 124 (unconnected to any electrode of the device) on the upper surface of the device.

P-base 120 is surrounded by P regions 126, 128, but is separated therefrom by relatively small regions of $N^-$ layer 118 which extend to the surface of the wafer to form respective channel regions 130, 132.

A cathode electrode 134, coupled to a cathode terminal K, makes ohmic contact to P regions 126 and 128. A first insulated gate 138, coupled to gate terminal $G_1$, overlies channel region 130. A second insulated gate 140, coupled to gate terminal $G_2$, overlies channel region 132 and, in addition, overlies the portion of P base 120 between $N^{++}$ emitter region 122 and channel region 132 at the upper surface of the wafer. Gates 138, 140 are preferably comprised of polysilicon and are insulated from the upper surface of the device by a layer of oxide (not shown in FIG. 2).

The operation of device 110 shown in FIG. 2 is as follows. In the on-state (with anode 112 at a positive potential with respect to cathode 134), the voltage applied to gate 138 should be sufficiently negative with respect to cathode 134 to turn-on the p-channel MOSFET under gate 138, and the voltage applied to gate 140 should be sufficiently positive to turn-on the n-channel MOSFET (in P base 120) under gate 140. This triggers thyristor 110 to the on-state by creating a conduction path from anode to cathode (upward in FIG. 2) via $P^{++}$ region 116, N layer 114, $N^-$ layer 118, through the n-channel in P base 120 at the surface of the wafer (created by gate 140), across $N^{++}$ emitter 122, through metal strap 124 to P base 120, through the p-channel (created by gate 138) in channel region 130, and through P region 126 to cathode 134.

The lateral length of $N^{++}$ emitter 122 is designed to create a sufficient voltage drop so that part of the $N^{++}$ emitter/P base junction becomes forward biased in the on-state to turn on the thyristor formed by regions 122, 120, 118, 114, and 116, whereby the main thyristor current will bypass the n-channel under gate 140 and instead flow directly upward through the device from $P^{++}$ region 116 through layers 114, 118, and 120 to $N^{++}$ emitter 122 and then through the floating metal strap 124 to 120, then through p-channel MOSFET under gate 138 and then through P region 126 to cathode 134.

Since the p-channel MOSFET under gate 138 is in series with the thyristor (116-114-118-120-122), the current through the device is limited by the saturation current of the p-channel MOSFET under gate 138. Thus, the device has current saturation characteristics. The saturation current depends on the voltage applied to gate 138.

To turn-off the device, a zero or positive potential with respect to the cathode is applied to gate 138 (to turn-off the MOSFET under gate 138), and a sufficiently negative potential is applied to gate 140 with respect to cathode 134 (to turn-off the n-channel MOSFET under gate 140 and turn-on the p-channel MOSFET under gate 140, thereby coupling P base 120 to P region 128, which is in turn electrically connected to the cathode. These respective potentials on gates 138, 140 are maintained in the forward blocking condition (anode at a positive potential with respect to cathode). The negative potential on gate 140 results in a high breakdown voltage for the device, because this keeps P base 120 of the thyristor at a lower potential compared to the $N^{++}$ emitter 122.

It should be noted that, during the forward blocking condition, the $N^{++}$ emitter/P base junction is reverse biased. Superior breakdown, turn-off characteristics and a wider Safe Operating Area are achieved by the present invention because this is similar to the case of the emitter-open turn off. In this regard, see, e.g., B. Jackson and D. Chen, "Effects of emitter-open switching on the turn-off characteristics of high voltage power transistors", *Power Electronics Specialist Conference*, June 1980.

The on-state voltage drop of the high-voltage MOS-controlled thyristor of the present invention is the sum of the voltage drop across the high voltage thyristor (112-116-114-118-120-122) and the voltage drop across the low voltage p-channel MOSFET (120-130-126-134) under gate 138. The voltage drop across the high voltage thyristor does not increase much when the device is designed to support higher breakdown voltage. In contrast, in an IGBT, the on-state voltage drop increases when the IGBT is designed for higher breakdown voltages. This is because, in the IGBT, only the bottom part of the drift region is conductivity modulated, while in a thyristor the entire drift region is conductivity modulated. Hence, advantageously, the MOS-controlled thyristor of the present invention has a lower forward voltage drop than an IGBT for the same current for higher breakdown voltage (>1200 V) devices.

Additionally, advantageously, the present invention requires no short circuit protection because of its on-state current saturation characteristics, described previously. This is a major advantage compared to a MCT. Also, advantageously, the present invention does not have any parasitic thyristor structure to degrade performance. This is a major advantage compared to the prior-art EST.

Finally, the present invention advantageously has lower turn-off losses as compared to a MCT. As stated previously, in the device of the present invention, the P base is connected to ground potential through the lateral p-channel MOSFET, reverse biasing the $N^{++}$ emitter/P base junction. This inactivates the NPN transistor by providing a reverse base drive, leading to disruption of the thyristor action faster as compared to a MCT and hence a faster decrease in current. The turn-off time of the device of the present invention is thus close to that of an IGBT (which has approximately an open-base PNP transistor turn-off time).

The embodiment of the present invention described above and shown in FIG. 2 relies upon the lateral voltage drop along P base 120 to forward-bias the NPN transistor to latch the thyristor. Consequently, P base 120 must be made relatively long with light doping. An alternative embodiment, shown in FIG. 3, eliminates this requirement.

Figure 3:
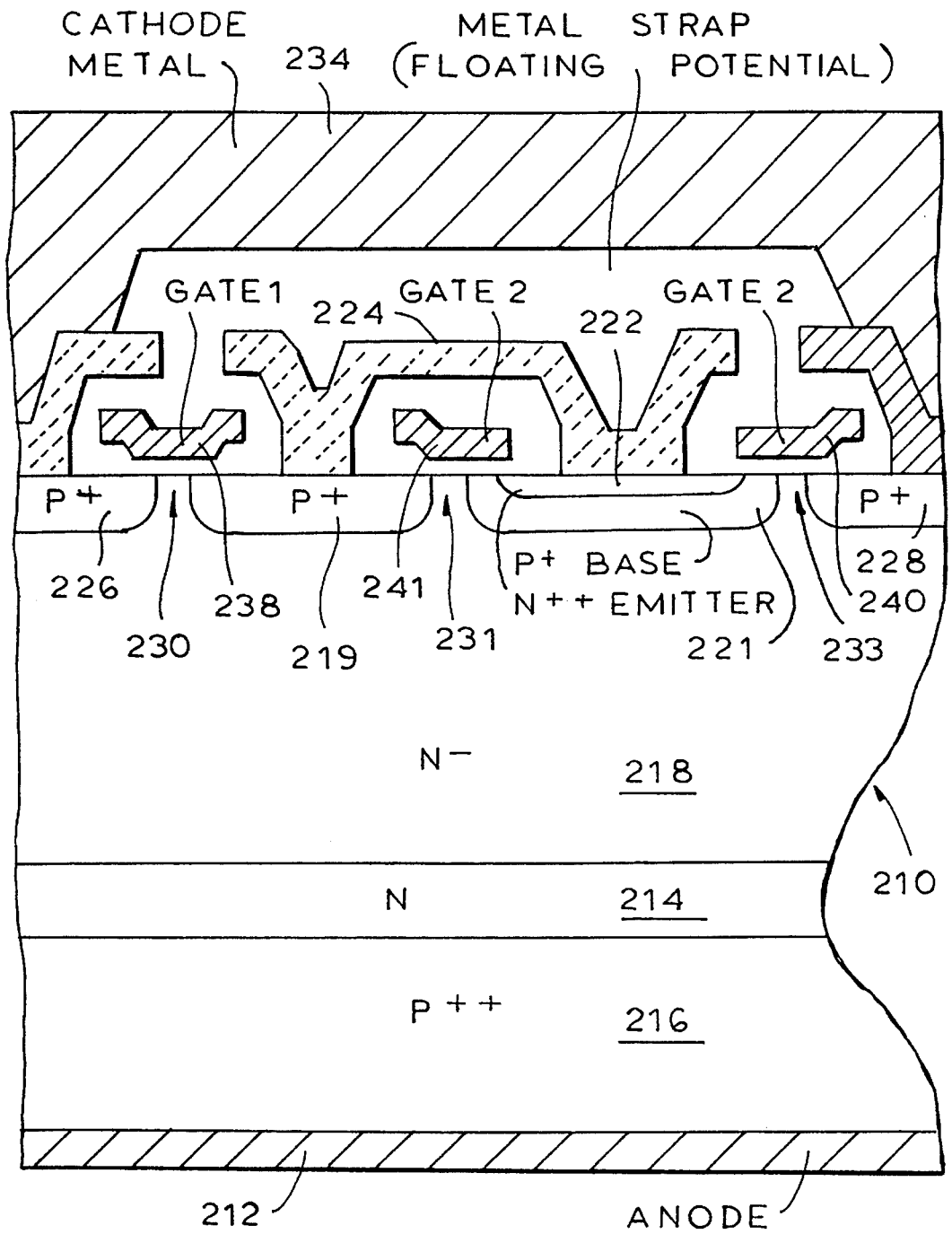
FIG. 3 is a cross-sectional view of a second embodiment of the present invention.

As in FIG. 2, the MOS-controlled thyristor 210 of FIG. 3 is a vertical conduction device with an N layer 214 and a very highly doped $P^{++}$ region 216 disposed on the underside of an $N^-$ layer 218. An anode 212 on the bottom surface of the device covers $P^{++}$ region 216. The layer thicknesses and concentrations depend on the device blocking voltage and are the same as the device of FIG. 2.

Disposed within $N^-$ layer 218 are: 1) a $P^+$ base 221; 2) a $P^+$ region 219 which forms the source of the p-channel MOSFET of the device, as described in further detail below; and 3) $P^+$ regions 226 and 228, which form the respective drains of p-channel MOSFETs of the device, as described in further detail below.

An $N^{++}$ emitter region 222 is disposed within a $P^+$ base 221, and is electrically shorted to $P^+$ region 219 by a floating metal strap 224 (unconnected to any electrode of the device) on the upper surface of the device.

$P^+$ regions 226 and 219, $P^+$ regions 219 and 221, and $P^+$ regions 221 and 228 are separated by relatively small regions of $N^-$ layer 218 which extend to the surface of the wafer to form respective channel regions 230, 231, 233.

A cathode electrode 234 makes ohmic contact to $P^+$ regions 226 and 228. A first insulated gate 238 overlies channel region 230. A second insulated gate 240 overlies channel region 233 and, in addition, overlies the portion of $P^+$ base 221 between $N^{++}$ emitter region 222 and channel region 233 at the upper surface of the wafer. A third insulated gate 241 overlies channel region 231 and, in addition, overlies the position of $P^+$ base 221 between $N^{++}$ emitter region 222 and channel region 231 of the upper surface of the wafer. Gates 238, 240, 241 are preferably comprised of polysilicon and are insulated from the upper surface of the device by a layer of oxide (not shown in FIG. 5). Gates 240 and 241 may be tied together (connected electrically).

Figure 5:
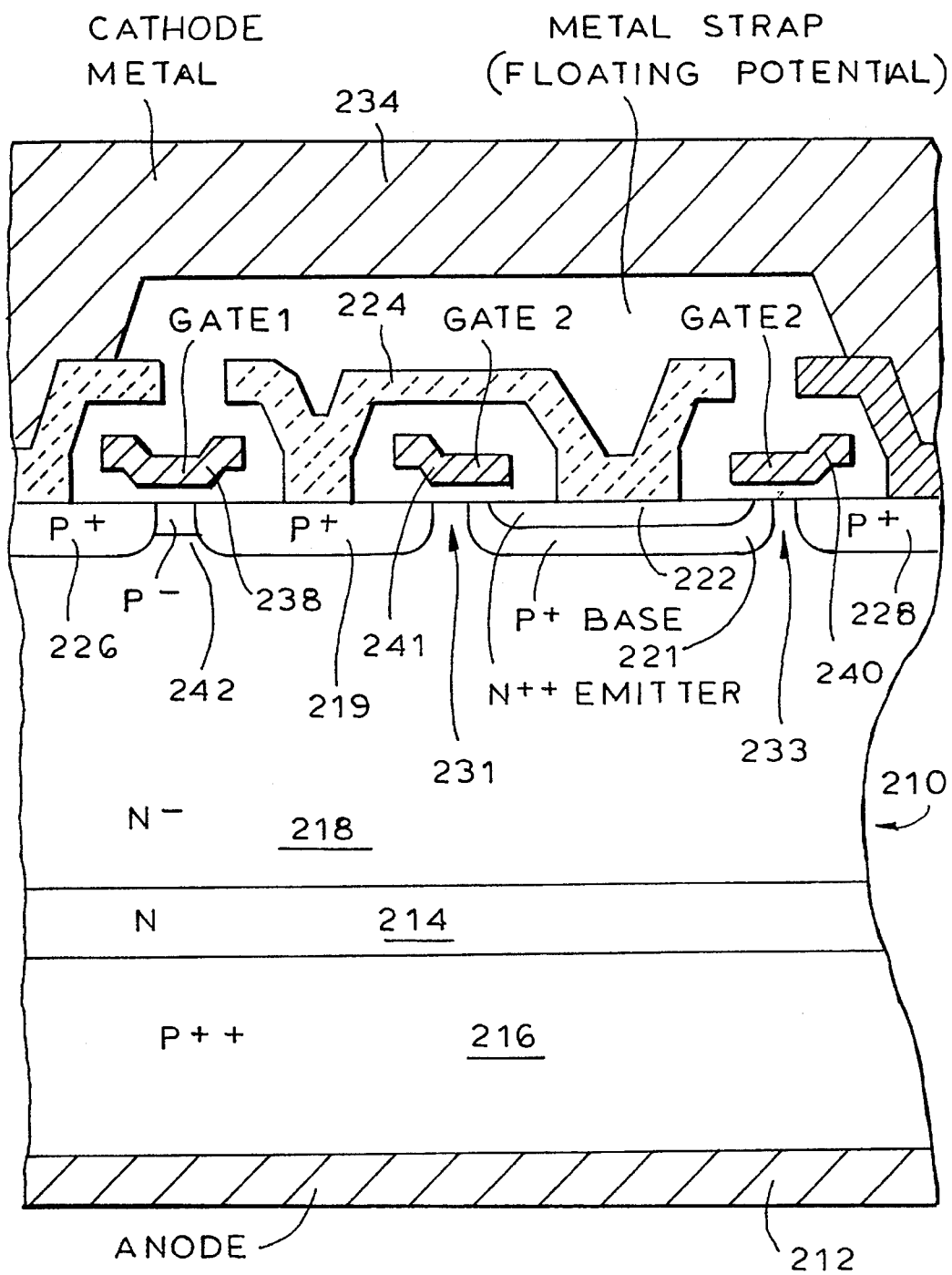
FIG. 5 is a cross-sectional view of a variation of the embodiment of FIG. 3 using a depletion p-channel MOSFET.

The operation of device 210 shown in FIG. 5 is as follows. In the on-state (with anode 212 at a positive potential with respect to cathode 234), the voltage applied to gate 238 should be sufficiently negative with respect to cathode 234 to turn-on the p-channel MOSFET under gate 238, and the voltage applied to gates 241 and 240 should be sufficiently positive to turn-on the n-channel MOSFETs (in $P^+$ base 221) under gates 241 and 240.

In this situation, $N^{++}$ emitter 222 is connected to ground potential by metal strap 224 and through the lateral PMOS created by the inversion of channel region 230, and the base drive for the vertical PNP transistor formed by layers 216-214-218-221 is provided through the n-channel MOSFETs under gates 240, 241. When the $P^{++}$ region/N junction is forward biased by about 0.7 volts, the $P^{++}$ region 216 starts injecting holes which supplies the base drive for the NPN transistor formed by layers 222-221-218-214, causing the thyristor formed by layers 216-214-218-221-222 to go into the latched state.

Thus, this triggers thyristor 210 to the on-state by creating a conduction path from anode to cathode (upward in FIG. 2) via $P^{++}$ region 216, N layer 214, $N^-$ layer 218, through the n-channels in $P^+$ base 221 at the surface of the wafer (created by gates 241 and 240), across $N^{++}$ emitter 222, through metal strap 224 to $P^+$ region 219, through the p-channel (created by gate 238) in channel region 230, and through $P^+$ region 226 to cathode 234.

After the thyristor formed by regions 216, 214, 218, 221 and 222 is turned-on, a major portion of the current will bypass the n-channel under gate 241 and 240, and instead flow directly upward through the device from $P^{++}$ region 216 through regions 214, 218, 221 to $N^{++}$ emitter 222 and then through the floating metal strap 224 to $P^+$ region 219, through the p-channel MOSFET under gate 238 to $P^+$ region 226 and then to cathode 234. Since the p-channel MOSFET under gate 238 is in series with the thyristor (216-214-218-221-222), the current through the device is limited by the saturation current of the p-channel MOSFET under gate 238. Thus, the device of FIG. 3, like the device of FIG. 2, has current saturation characteristics. The saturation current depends on the voltage applied to gate 238. Advantageously, the thyristor can be turned-off by merely reducing the voltages of gates 238, 240, 241 to zero.

To turn-off the device faster, a zero or positive potential with respect to the cathode is applied to gate 238 (to turn-off the MOSFET under gate 238), and a sufficient negative potential is applied to gate 240 and 241 with respect to cathode 234 (to turn-off the n-channel MOSFETs under gate 240 and 241 and turn-on the p-channel MOSFET under gate 240, thereby coupling $P^+$ base 221 to $P^+$ region 228, which is in turn electrically connected to the cathode. These respective potentials on gates 238, 240, 241 are maintained in the forward blocking condition (anode at a positive potential with respect to cathode). The negative potential on gate 240 results in a high breakdown voltage for the device, because this keeps $P^+$ base 221 of the thyristor at a lower potential compared to the $N^{++}$ emitter 222.

Figure 4:
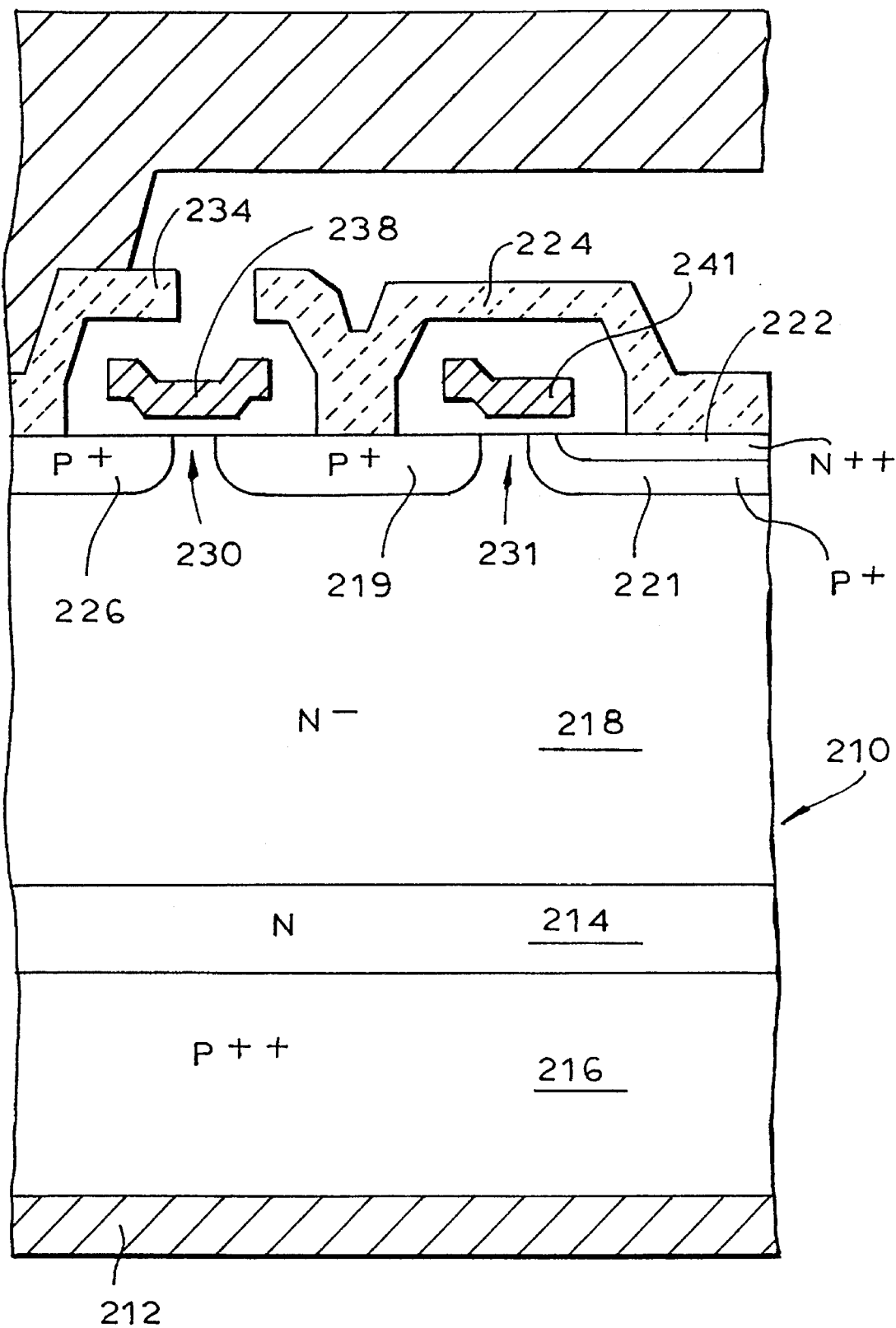
FIG. 4 is a cross-sectional view of a variation of the embodiment of FIG. 3 without a third P-type region and without an associated third gate.

FIG. 4 shows a variation of the structure of FIG. 3 by eliminating the $P^+$ region 228, associated cathode metal 234 contact to this region, gate 240 and channel region 233. In this embodiment, during turn-off and forward blocking state, the $N^{++}$ emitter 222 is merely shorted to the $P^+$ base 221 through the floating metal strap 224 and the p-channel region 231 under gate 241.

Another variation of the structure of FIG. 3 is obtained by eliminating the gate 241 or by leaving it electrically floating.

Yet another variation of the structure of FIG. 3 is shown in FIG. 5 which uses a depletion p-channel MOSFET, created by forming a $P^-$ region 242 between $P^+$ regions 219, 226 at the upper surface of the wafer. In this embodiment, gate 238 can be set at 0 volts with respect to the cathode in the on-state. In the off-state, in this embodiment, gate 238 has to be sufficiently positive with respect to the cathode to fully pinch-off the $P^+$ region.

FIG. 6 shows a variation of the structure of FIG. 4 using a depletion p-channel MOSFET, created by diffusing a $P^-$ region 242 between $P^+$ regions 219, 226 at the upper surface of the wafer. In this embodiment, as in the embodiment of FIG. 5, gate 238 can be set at 0 volts with respect to the cathode in the on-state. In the off-state, gate 238 has to be sufficiently positive with respect to the cathode to fully pinch-off the $P^-$ region.

Figure 7:
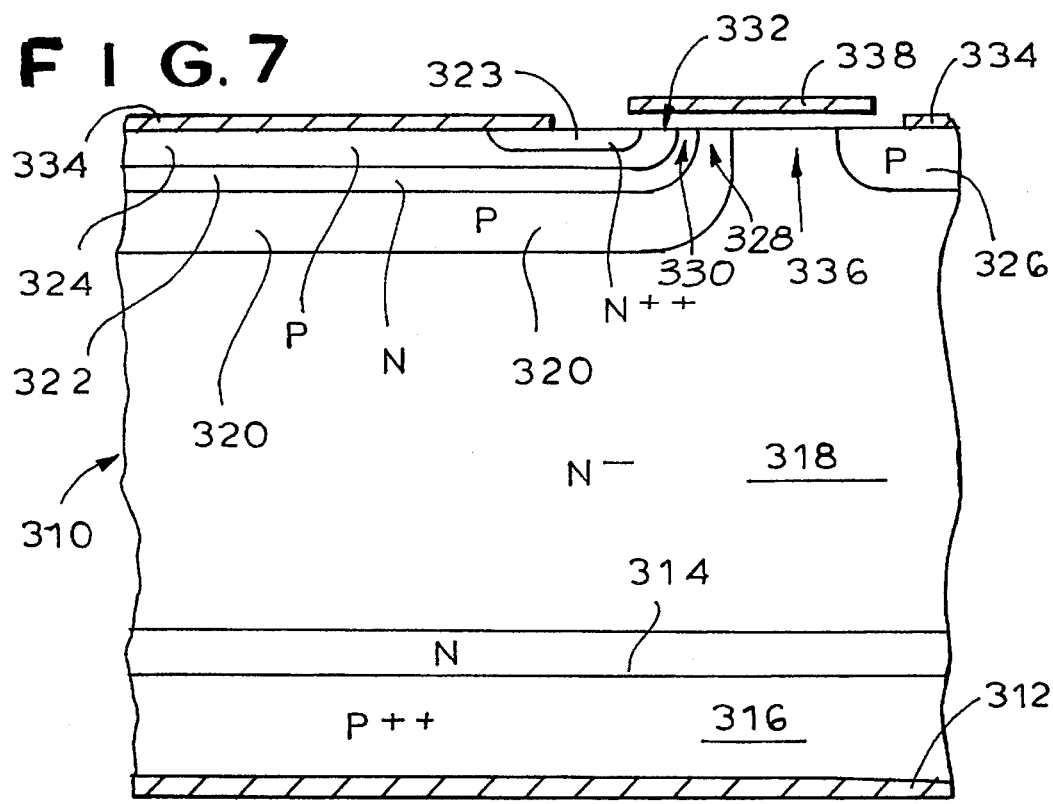
FIG. 7 is a cross-sectional view of a third embodiment of the invention, which requires only a single gate drive.

The embodiments of the present invention described above and shown in FIGS. 2–6 require two separate gates and thus yield a device with four terminals. An alternative embodiment of the invention, shown in FIG. 7, uses a single gate drive and thus yields a three terminal structure. As in the devices of FIGS. 2–6, the MOS-controlled thyristor 310 of FIG. 7 is a vertical conduction device with an N layer 314 and a very highly doped P⁺⁺ region 316 disposed on the underside of an N⁻ layer 318. As in the previous embodiments, an anode 312 on the bottom surface of the device covers P⁺⁺ region 316.

Disposed within N⁻ layer 318 and extending down from the upper surface of the device is a P well 320, which forms the source of a p-channel MOSFET and the channel region 328 of an n-channel MOSFET, as described in further detail below. Disposed within P well 320 is an N well 322, which forms the drain of the n-channel MOSFET and the channel region 330 of a p-channel MOSFET referenced above and described below. N well 322 is radially inwardly spaced along the first semiconductor surface from edges of P well 320, thereby defining channel region 328 of an n-channel MOSFET in the P well.

Disposed within N well 322 is a P-type base 324, which forms the channel region 332 of a n-channel MOSFET, again as described below. P base 324 is radially inwardly spaced along the first semiconductor surface from edges of N well 322, thereby defining channel region 330 of a p-channel MOSFET in the N well. P base 324 extends along the upper surface of the wafer and is contacted by cathode electrode 334. An N⁺⁺ source region 323 is disposed within P-base 324, and is also contacted, along its upper surface, by cathode electrode 334. N⁺⁺ source 323 is radially inwardly spaced along the first semiconductor surface from edges of P base 324, thereby defining channel region 332 of an n-channel MOSFET in the P base.

A P region 326 extends downward from the upper surface of the wafer and is spaced from P well 320 by a portion of N⁻ epi 318 which extends up to the surface of the wafer to form a channel region 336. P region 326 is electrically contacted by cathode electrode 334.

A single insulated gate 338 overlies channel region 336, and also extends laterally over channel regions 328, 330 and 332. Gate 338 is preferably comprised of polysilicon and is insulated from the upper surface of the device by a layer of oxide (not shown in FIG. 7).

The operation of device 310 shown in FIG. 7 is as follows. In the on-state (with anode 312 at a positive potential with respect to cathode 334), the voltage applied to gate 338 should be sufficiently positive with respect to cathode to invert channel regions 328 and 332 and thereby turn-on both of the n-channel MOSFETs under the gate, creating a forward conduction path to N⁺⁺ source 323, which, as stated previously and as shown in FIG. 7, is electrically contacted by cathode 334. This provides the base drive for the PNP transistor (formed by layers 316-314-318-320) to latch the thyristor. The device thus operates as a thyristor (formed by layers 316-314-318-320-322) in series with an n-channel MOSFET (formed by 322-332-323) in the on-state.

To turn-off the device, the voltage on gate 338 should be made sufficiently negative with respect to cathode 334 to invert channel regions 330 and 336, thereby turning-on both of the p-channel MOSFETs under gate 338 and connecting the P diffused regions to cathode (ground) potential. As in the previously described embodiments, the MOS-controlled thyristor of FIG. 7 has current saturation characteristics because of the MOSFET in series with the thyristor and fast turn-off because the thyristor current is quickly drained to ground by the inversion of channel regions 336 and 330, creating p-channels which effectively shorts P well 320 to cathode 334 (ground).

Figure 8A:
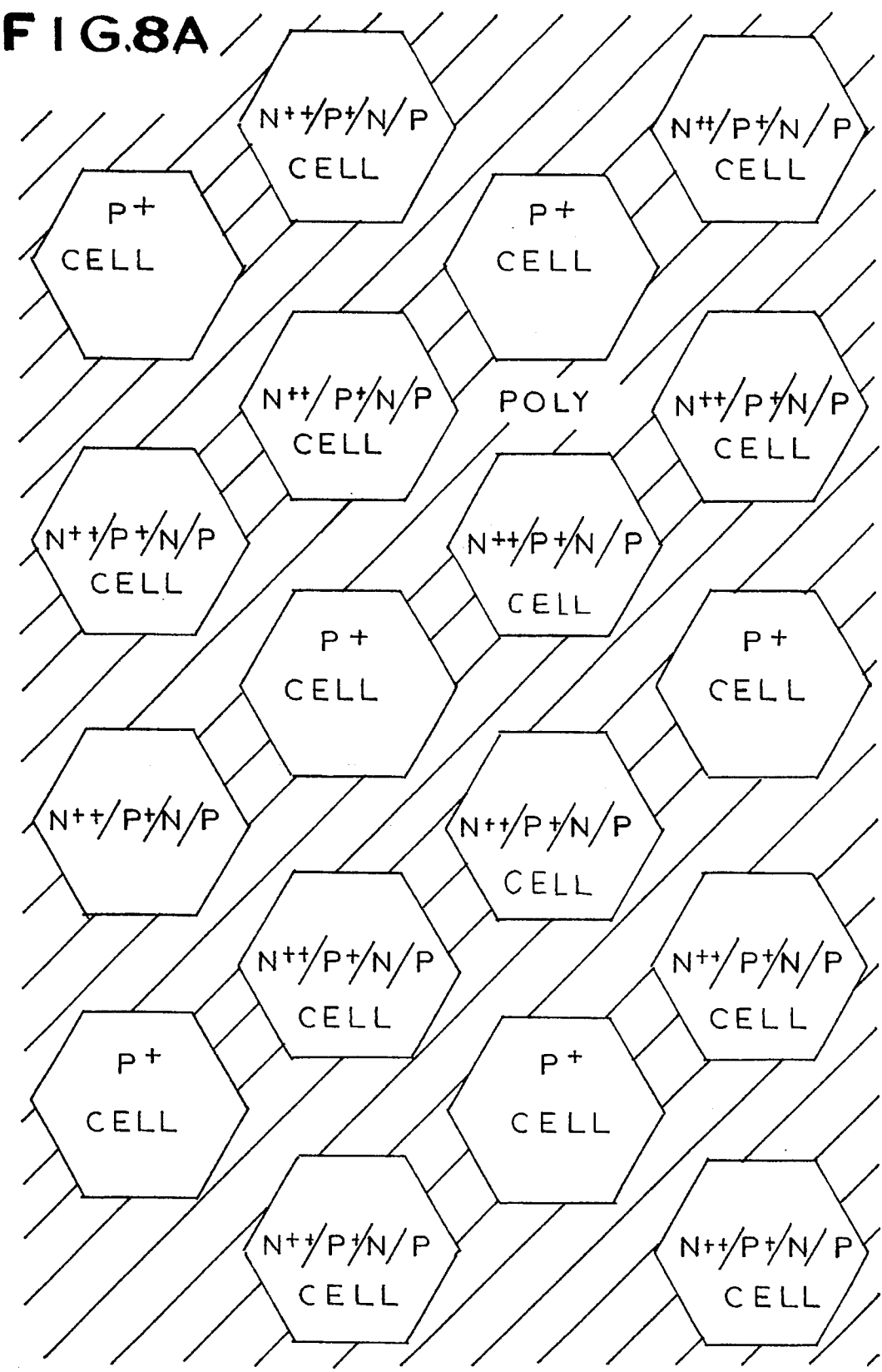
FIGS. 8A and 8B are top views showing two different possible cellular layouts of the embodiment of FIG. 7.
Figure 8B:
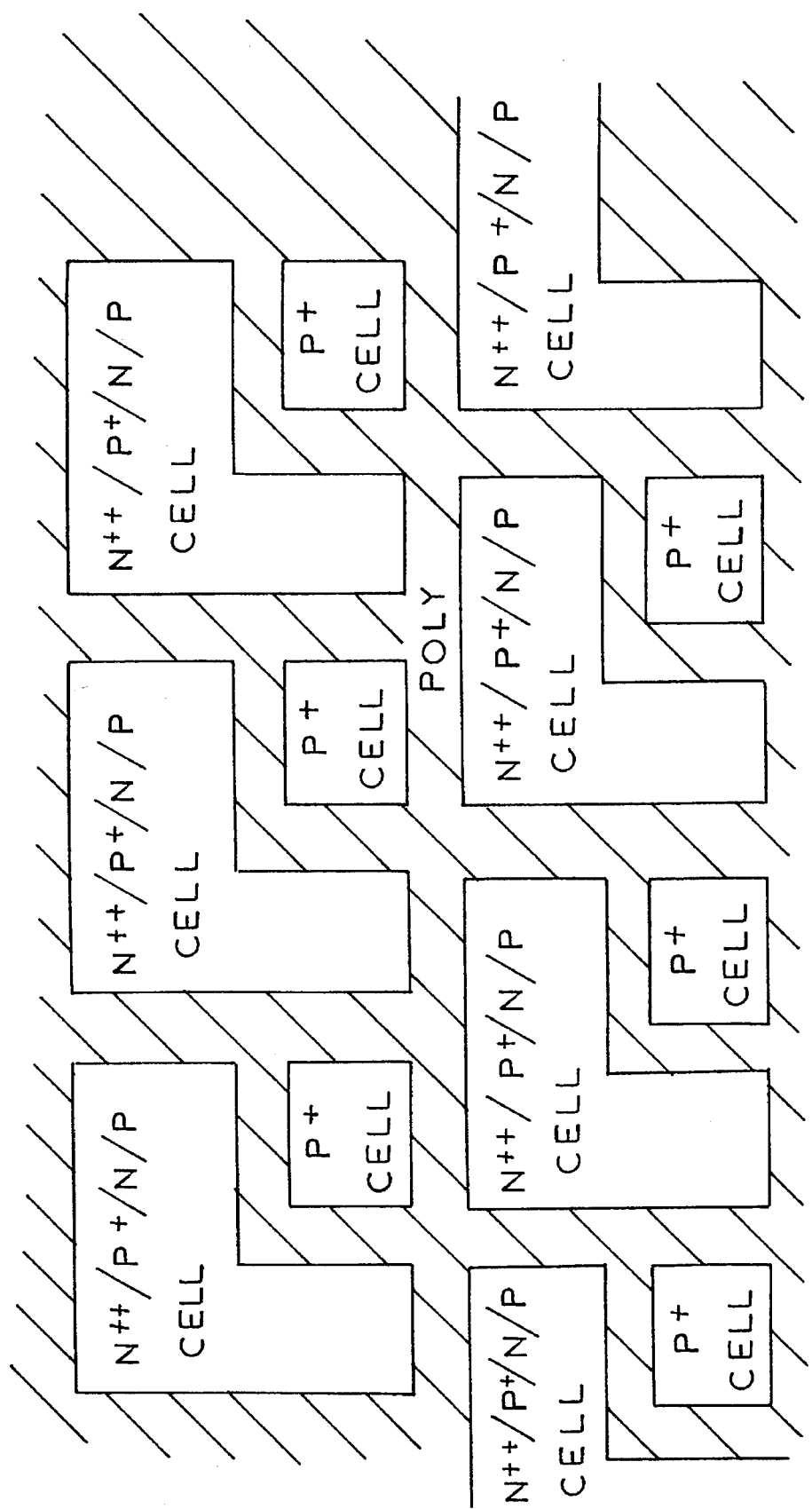

The embodiment of the present invention shown in FIG. 7 can be implemented with a cellular layout, as shown in the top views of FIGS. 8A and 8B, wherein the four layer P well region of FIG. 7 is identified as a N⁺⁺/P⁺/N/P cell. In the layout of FIG. 8A, the wafer has ⅔ N⁺⁺/P⁺/N/P cells and ⅓ P⁺ cells. Each N⁺⁺/P⁺/N/P cell has three adjacent P⁺ cells. FIG. 8B shows the top view of another possible cellular layout for the embodiment of FIG. 7.

Figure 9A:
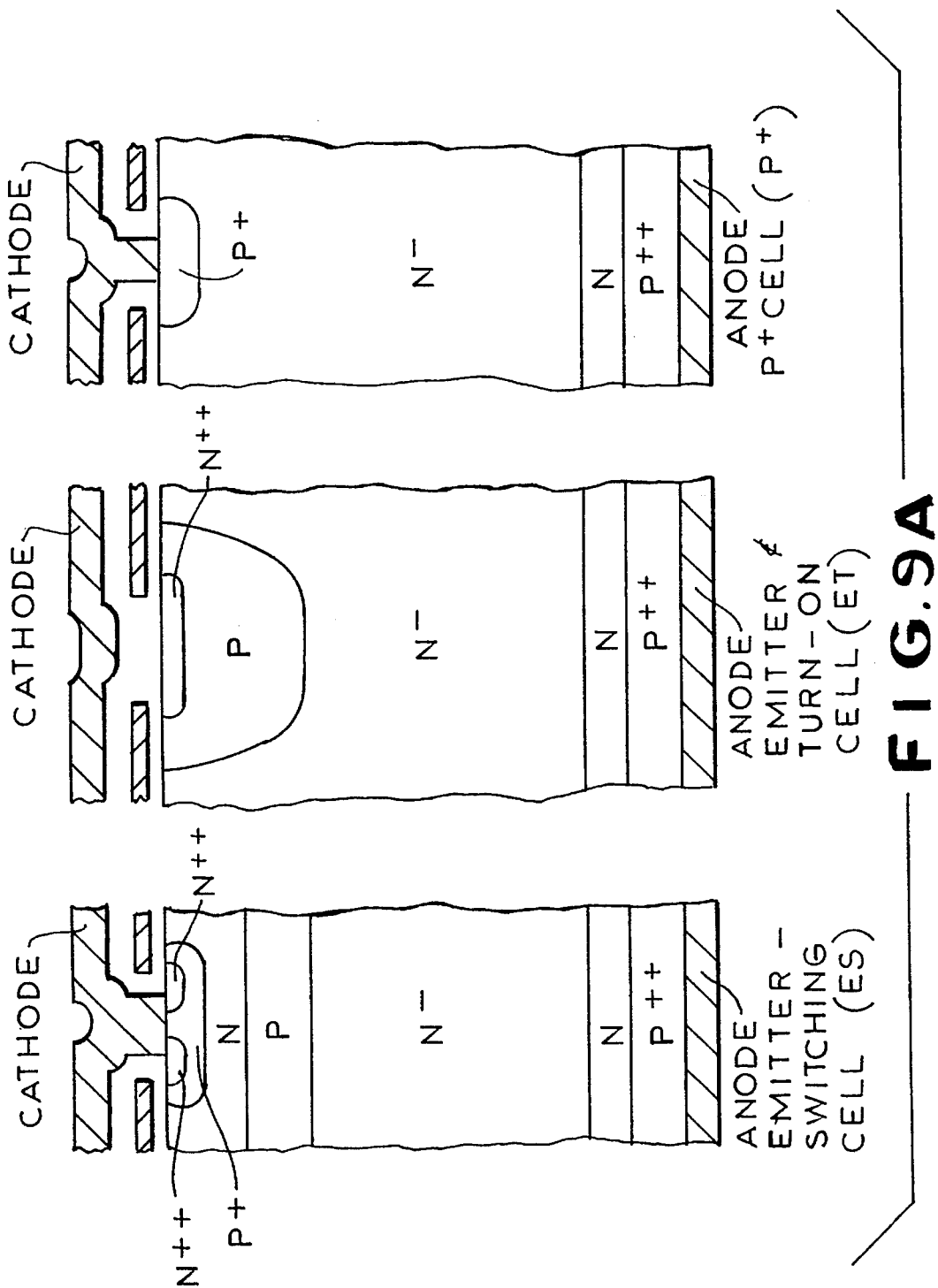
FIGS. 9A is a cross-sectional view of the three elements or cells which, when combined in a cluster, form a fourth embodiment of the invention.

Yet another alternative embodiment of the invention, shown in FIGS. 9A, 9B, 9C and 9D, uses a single gate drive and thus yields a three terminal structure. This embodiment is formed of an array of clusters of cells—FIG. 9B shows a unit cluster, each cluster being formed of the three elements shown in FIG. 9A, namely an Emitter-Switching cell (ES), an Emitter & Turn-On Cell (ET) and a P⁺ cell (P⁺). The unit cluster shown in FIG. 9B is repeated to form the active area of the chip. One or two lines of P⁺ cells are preferably disposed at the edge of the active area of the chip.

As in the devices of FIGS. 2–7, the MOS-controlled thyristor 410 of FIGS. 9A, 9B, 9C and 9D is a vertical conduction device with an N layer 414 and a very highly doped P⁺⁺ region 416 disposed on the underside of an N⁻ layer 418. As in the previous embodiments, an anode 412 on the bottom surface of the device covers P⁺⁺ region 416.

Figure 9D:
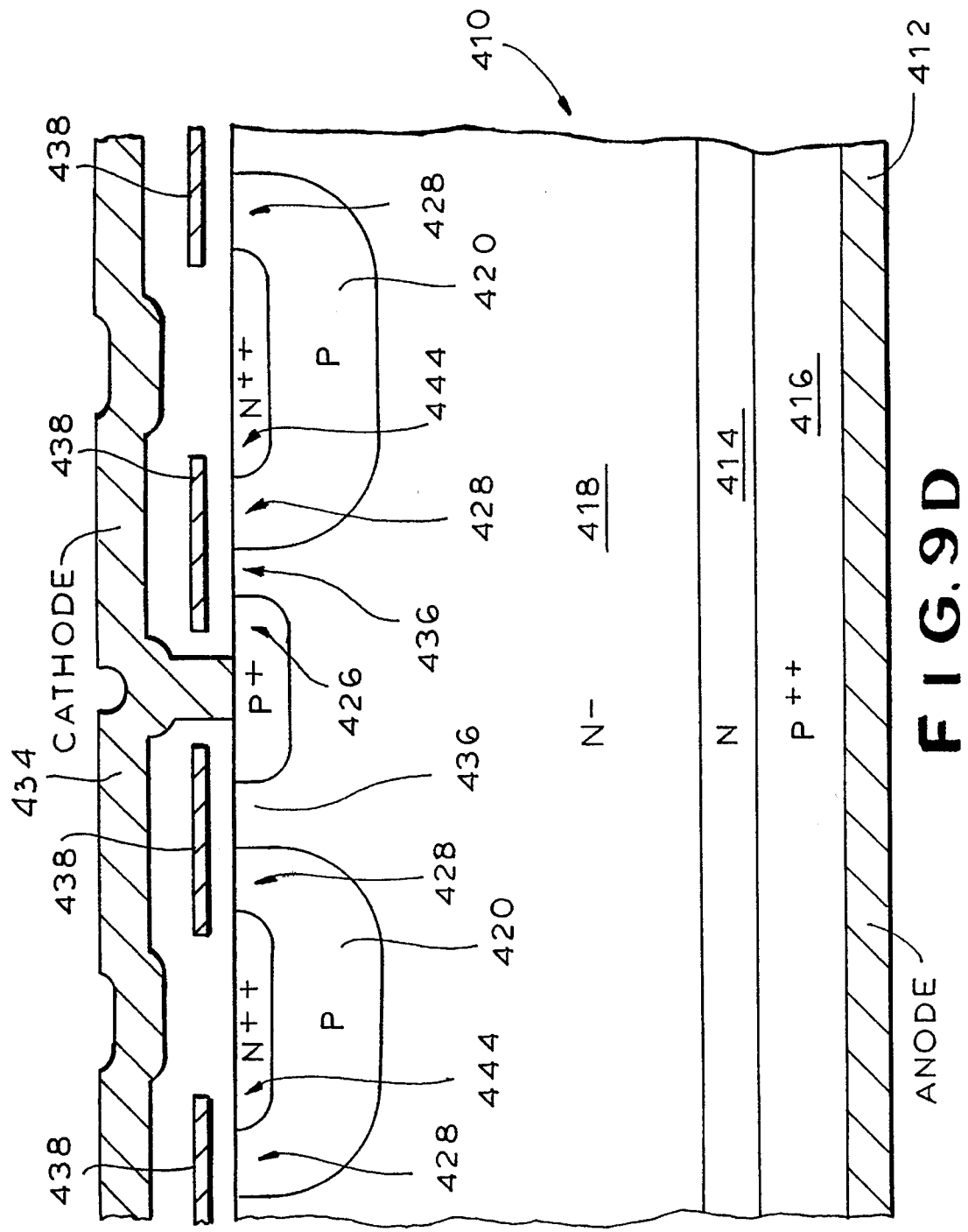
FIG. 9D is a cross-sectional view through section line 2—2 of FIG. 9B.

As shown in FIG. 9C and FIG. 9D, disposed within N⁻ layer 418 and extending down from the upper surface of the device is a P well 420, which forms the source of a p-channel MOSFET and the channel region 428 of an n-channel MOSFET, as described in further detail below. Disposed within P well 420 is an N well 422, which forms the drain of the n-channel MOSFET. Disposed within a region of the N well 422 is a P⁺ base 424, which forms the channel region 432 of a n-channel MOSFET, again as described below. P⁺ base 424 extends along the upper surface of the wafer and is contacted by cathode electrode 434. N⁺⁺ source region 423 is radially inwardly spaced along the first semiconductor surface from edges of P⁺ base 424, thereby defining channel region 432 of an n-channel MOSFET in the P⁺ base. An N⁺⁺ emitter region 444 is disposed within P well 420 and is connected to the N well 422. N⁺⁺ emitter region 444 is radially inwardly spaced along the first semiconductor surface from at least one edge of P well 420, thereby defining channel region 428 of an n-channel MOSFET in the P well.

As shown in FIG. 9D, a P⁺ region 426 extends downward from the surface of the wafer and is spaced from P well 420 by a portion of N⁻ 418 which extends up to the surface of the wafer to form a channel region 436. P⁺ region 426 is electrically contacted by cathode electrode 434.

A grid structure of a single insulated gate 438 overlies channel region 436, and also overlies channel regions 428 and 432. Gate 438 is preferably comprised of polysilicon and is insulated from the upper surface of the device by a layer of oxide (not shown).

The operation of device 410 shown in FIGS. 9A, 9B, 9C and 9D is as follows. In the on-state (with anode 412 at a positive potential with respect to cathode 434), the voltage applied to gate 438 should be sufficiently positive with respect to cathode to invert channel regions 428 and 432 and thereby turn-on both of the n-channel MOSFETs under the gate, creating a forward conduction path to N⁺⁺ source 423, which, as stated previously and as shown in FIG. 9C, is electrically contacted by cathode 434. This provides the base drive for the PNP transistor (416-414-418-420) to latch the thyristor. The device thus operates as a thyristor (formed by layers 416-414-418-420-444) in series with an n-channel MOSFET (formed by 444-422-432-423) in the on-state.

To turn-off the device, the voltage on gate 438 should be made sufficiently negative with respect to cathode 434 to invert channel region 436, thereby turning-on the p-channel MOSFET under gate 438 and connecting the P well regions to cathode (ground) potential. As in the previously described embodiments, the MOS-controlled thyristor of FIGS. 9A, 9B, 9C and 9D has current saturation characteristics because of the MOSFET in series with the thyristor, and has fast turn-off because the thyristor current is quickly drained to ground by the inversion of channel region 436, creating a p-channel which effectively shorts P well 420 to cathode 434 (ground).

Although the present invention has been described in relation to particular embodiments thereof, many other variations and modifications (such as using trench gates instead of surface planar gates and different gate and channel region layout) will become apparent to those skilled in the art. It is preferred, therefore, that the present invention be limited not by the specific disclosure herein, but only by the appended claims.

What is claimed is:

1. A MOS-controlled thyristor, comprising:
   a wafer of semiconductor material having first and second spaced, parallel planar surfaces, at least a portion of the thickness of the wafer which extends from said first semiconductor surface comprising a relatively lightly doped N-type layer for receiving junctions, at least a portion of the thickness of said wafer which extends from said second semiconductor surface comprising a relatively highly doped P-type layer;
   a P-type base formed in said relatively lightly doped N-type epitaxially deposited layer and extending from said first semiconductor surface to a first depth beneath said first semiconductor surface;
   an N-type emitter region formed in said P-type base and extending from said first semiconductor surface to a second depth beneath said semiconductor surface which is shallower than said first depth to create an N-type emitter/P-type base junction, said N-type emitter region being radially inwardly spaced along said first semiconductor surface along edges of said P-type base, such that said edges of said P-type base extend to said first semiconductor surface, thereby defining a first channel region along a first of said edges, a metal strap being disposed on said first semiconductor surface and connecting said emitter region to said P-type base along a second of said edges;
   first and second P-type regions formed in said relatively lightly doped N-type layer and extending from said first surface of said wafer, said first and second P-type regions being laterally spaced from said second and first edges of said P-type base, respectively, to form second and third channel regions in said relatively lightly doped N-type epitaxial layer;
   first gate insulation layer means on said first semiconductor surface disposed at least on said second channel region;
   first gate electrode means on said first gate insulation layer means and overlying said second channel region;
   second gate insulation layer means on said first semiconductor surface disposed at least on said first and third channel regions;
   second gate electrode means on said second gate insulation layer means and overlying said first and third channel regions;
   anode electrode means connected to said P-type layer disposed on said second semiconductor surface; and
   cathode electrode means connected to said first and second P-type regions on said first semiconductor surface.

2. The MOS-controlled thyristor of claim 1, further comprising a N-type layer disposed between said P-type layer and said relatively lightly doped N-type layer.

3. The MOS-controlled thyristor of claim 1, wherein said N-type emitter has a lateral length which creates a sufficient voltage drop in said P-type base to forward bias said N-type emitter/P-type base junction when said thyristor is in an on-state.

4. The MOS-controlled thyristor of claim 1, wherein said P-type layer and said N-type emitter are relatively highly doped.

5. A MOS-controlled thyristor, comprising:
   a wafer of semiconductor material having first and second spaced, parallel planar surfaces, at least a portion of the thickness of said wafer which extends from said first semiconductor surface comprising a relatively lightly doped N-type layer for receiving junctions, at least a portion of the thickness of said wafer which extends from said second semiconductor surface comprising a relatively highly doped P-type layer;
   a P-type base formed in said relatively lightly doped N-type layer and extending from said first semiconductor surface to a first depth beneath said first semiconductor surface;
   an N-type emitter region formed in said P-type base and extending from said first semiconductor surface to a second depth beneath said semiconductor surface which is shallower than said first depth to create an N-type emitter/P-type base junction, said N-type emitter region being radially inwardly spaced along said first semiconductor surface along edges of said P-type base, such that said edges of said P-type base extend to said first semiconductor surface, thereby defining first and second channel regions along said edges;
   first and second P-type regions formed in said relatively lightly doped N-type layer and extending from said first surface of said wafer, said first and second P-type regions being laterally spaced from each other and from said P-type base to form respective third and fourth channel regions in said relatively lightly doped N-type layer, a metal strap being disposed on said first semiconductor surface and connecting said N-type emitter region to said second P-type region;
   a third P-type region formed in said relatively lightly doped N-type layer and extending from said first surface of said wafer, said third P-type region being laterally spaced from said P-type base to form a fifth channel region in said N-type layer;
   first gate insulation layer means on said first semiconductor surface disposed at least on said third channel region;
   first gate electrode means on said first gate insulation layer means and overlying said third channel region;
   second gate insulation layer means on said first surface disposed at least on said first and fourth channel regions;
   second gate electrode means on said second gate insulation layer means and overlying said first and fourth channel regions;
   third gate insulation layer means on said first surface disposed at least on said second and fifth channel regions;
   third gate electrode means on said third gate insulation layer means and overlying said second and fifth channel regions;

anode electrode means connected to said P-type layer disposed on said second semiconductor surface; and cathode electrode means connected to said first and third P-type regions on said first semiconductor surface.

6. The MOS-controlled thyristor of claim 5, further comprising a N-type layer disposed between said P-type layer and said relatively lightly doped N-type layer.

7. A MOS-controlled thyristor, comprising:

a wafer of semiconductor material having first and second spaced, parallel planar surfaces, at least a portion of the thickness of said wafer which extends from said first semiconductor surface comprising a relatively lightly doped N-type layer for receiving junctions, at least a portion of the thickness of said wafer which extends from said second semiconductor surface comprising a relatively highly doped P-type layer;

a P-type base formed in said relatively lightly doped N-type layer and extending from said first semiconductor surface to a first depth beneath said first semiconductor surface;

an N-type emitter region formed in said P-type base and extending from said first semiconductor surface to a second depth beneath said semiconductor surface which is shallower than said first depth to create an N-type emitter/P-type base junction, said N-type emitter region being radially inwardly spaced along said first semiconductor surface along one edge of said P-type base, such that said one edge of said P-type base extends to said first semiconductor surface, thereby defining a first channel region along said edge;

first and second P-type regions formed in said relatively lightly doped N-type layer and extending from said first surface of said wafer, said first and second P-type regions being laterally spaced from each other and said second P-type region being laterally spaced from said P-type base to form respective second and third channel regions in said relatively lightly doped N-type layer, a metal strap being disposed on said first semiconductor surface and connecting said N-type emitter region to said second P-type region;

first gate insulation layer means on said first semiconductor surface disposed at least on said second channel region;

first gate electrode means on said first gate insulation layer means and overlying said second channel region;

second gate insulation layer means on said first surface disposed at least on said first and third channel regions;

second gate electrode means on said second gate insulation layer means and overlying said first and third channel regions;

anode electrode means connected to said P-type layer disposed on said second semiconductor surface; and cathode electrode means connected to said first and third P-type regions on said first semiconductor surface.

8. The MOS-controlled thyristor of claim 1, further comprising a relatively lightly doped P-type region disposed in said second channel region between said first and second P-type regions to form a depletion p-channel MOSFET.

9. The MOS-controlled thyristor of claim 5, further comprising a relatively lightly doped P-type region disposed in said second channel region between said first and second P-type regions to form a depletion P-channel MOSFET.

10. The MOS-controlled thyristor of claim 7, further comprising a relatively lightly doped P-type region disposed in said second channel region between said first and second P-type regions to form a depletion P-channel MOSFET.

11. The MOS-controlled thyristor of claim 5, wherein said first, second and third P-type regions, and said P-type base are relatively highly doped, and said P-type layer and said N-type emitter are relatively highly doped.

12. The MOS-controlled thyristor of claim 5, wherein said second gate electrode is electrically floating or absent.

13. A MOS-controlled thyristor, comprising:

a wafer of semiconductor material having first and second spaced, parallel planar surfaces, at least a portion of the thickness of said wafer which extends from said first semiconductor surface comprising a relatively lightly doped N-type layer for receiving junctions, at least a portion of the thickness of said wafer which extends from said second semiconductor surface comprising a highly doped P-type layer;

a P-type well formed in said relatively lightly doped N-type epitaxially deposited layer and extending from said first semiconductor surface to a first depth beneath said first semiconductor surface;

an N-type well formed in said relatively lightly doped N-type layer and extending from said first semiconductor surface to a second depth beneath said first semiconductor surface which is shallower than said first depth, said N-type well being radially inwardly spaced along said first semiconductor surface from an edge of said P-type well, thereby defining a first channel region, said first channel region being disposed in said P-type well near said first semiconductor surface;

a P-type base formed in said relatively lightly doped N-type layer and extending from said first semiconductor surface to a third depth beneath said semiconductor surface which is shallower than said second depth, said P-type base being radially inwardly spaced along said first semiconductor surface from an edge of said N-type well, thereby defining a second channel region, said second channel region being disposed in said N-type well near said first semiconductor surface;

an N-type source region formed in said P-type base and extending from said first semiconductor surface to a fourth depth beneath said semiconductor surface which is shallower than said third depth to create an N-type source/P-type base junction, said N-type source region being radially inwardly spaced along said first semiconductor surface from an edge of said P-type base, thereby defining a third channel region, said third channel region being disposed in said P-type base near said first semiconductor surface;

a P-type region formed in said relatively lightly doped N-type layer and extending from said first surface of said wafer, said P-type region being laterally spaced from said edge of said P-type well to define a fourth channel region, said fourth channel region being disposed in said relatively lightly doped N-type epitaxial layer between said P-type region and said P-type well near said first semiconductor surface;

gate insulation layer means on said first semiconductor surface disposed at least on said first, second, third and fourth channel regions;

gate electrode means on said gate insulation layer means and overlying said first, second, third and fourth channel regions;

anode electrode means connected to said P-type layer disposed on said second semiconductor surface; and cathode electrode means connected to said P-type base, said N-type emitter and said P-type region on said first semiconductor surface.

14. The MOS-controlled thyristor of claim 13, further comprising a N-type layer disposed between said P-type layer and said relatively lightly doped N-type layer.

15. The MOS-controlled thyristor of claim 13, wherein said P-type layer and said N-type emitter are relatively highly doped.

16. The MOS-controlled thyristor of claim 13, wherein said P-type well and said first P-type region each comprise cells, said cells being disposed side-by-side in a symmetric array.

17. The MOS-controlled thyristor of claim 16, wherein said cells have a polygonal shape.

18. The MOS-controlled thyristor of claim 16, wherein said cells are arranged in an array comprising a plurality of parallel-connected symmetrically disposed polygonal-shaped cells, and wherein said electrode means comprises a grid which overlies said array.

19. A MOS-controlled thyristor, comprising:
- a wafer of semiconductor material having first and second spaced, parallel planar surfaces, at least a portion of the thickness of said wafer which extends from said first semiconductor surface comprising a relatively lightly doped N-type layer for receiving junctions, at least a portion of the thickness of said wafer which extends from said second semiconductor surface comprising a heavily doped P-type layer;
- a P-type well formed in said relatively lightly doped N-type layer and extending from said first semiconductor surface to a first depth beneath said first semiconductor surface;
- an N-type well formed in said relatively lightly doped N-type layer and extending from said first semiconductor surface to a second depth beneath said first semiconductor surface which is shallower than said first depth, said N-type well being radially inwardly spaced along said first semiconductor surface from an edge of said P-type well;
- a P-type base formed in said relatively lightly doped N-type layer and extending from said first semiconductor surface to a third depth beneath said semiconductor surface which is shallower than said second depth, said P-type base being radially inwardly spaced along said first semiconductor surface from an edge of said N-type well;
- an N-type source region formed in said P-type base and extending from said first semiconductor surface to a fourth depth beneath said semiconductor surface which is shallower than said third depth to create an N-type source/P-type base junction, said N-type source region being radially inwardly spaced along said first semiconductor surface from an edge of said P-type base, thereby defining a first channel region, said first channel region being disposed in said P-type base near said first semiconductor surface;
- an N-type emitter region formed in said P-type well and extending from said first semiconductor surface to a fifth depth beneath said semiconductor surface which is shallower than said first depth, said N-type emitter region being radially inwardly spaced along said first semiconductor surface from edges of said P-type well, thereby defining a second channel region, said second channel region being disposed in said P-type well near said first semiconductor surface;
- a P-type region formed in said relatively lightly doped N-type layer and extending from said first surface of said wafer, said P-type region being laterally spaced from said edge of said P-type well to define a third channel region, said third channel region being disposed in said relatively lightly doped N-type epitaxial layer between said P-type region and said P-type well near said first semiconductor surface;
- gate insulation layer means on said first semiconductor surface disposed at least on said first, second and third channel regions;
- gate electrode means on said gate insulation layer means and overlying said first, second and third channel regions;
- anode electrode means connected to said P-type layer disposed on said second semiconductor surface; and
- cathode electrode means connected to said P-type base, said N-type source and said P-type region on said first semiconductor surface.

20. The MOS-controlled thyristor of claim 19, further comprising a N-type layer disposed between said P-type layer and said relatively lightly doped N-type layer.

21. The MOS-controlled thyristor of claim 19, wherein said P-type layer, said N-type source and said N-type emitter are relatively highly doped.

22. The MOS-controlled thyristor of claim 19, wherein said P-type well, N-type well, said P-type base and said N-type source together comprise a first cell, said N-type emitter disposed within said P-type well comprises a second cell, and said P-type region comprises a third cell, said cells being disposed side-by-side in a symmetric array.

23. The MOS-controlled thyristor of claim 22, wherein said cells have a polygonal shape.

24. The MOS-controlled thyristor of claim 22, wherein said cells are arranged in an array comprising a plurality of parallel-connected symmetrically disposed polygonal-shaped cells, and wherein said electrode means comprises a grid which overlies said array.

* * * * *